United States Patent [19]
Nagano

[11] Patent Number: 4,565,973
[45] Date of Patent: Jan. 21, 1986

[54] CURRENT AMPLIFYING CIRCUIT

[75] Inventor: Katsumi Nagano, Hiratsuka, Japan

[73] Assignee: Tokyo Shibaura Denki Kabushiki Kaisha, Japan

[21] Appl. No.: 319,413

[22] Filed: Nov. 9, 1981

[30] Foreign Application Priority Data

Nov. 12, 1980 [JP] Japan ............... 55-159267

[51] Int. Cl.$^4$ .............................. H03F 3/04
[52] U.S. Cl. .................... 330/288; 323/316
[58] Field of Search ........... 330/257, 288; 323/315, 323/316; 307/297

[56] References Cited

U.S. PATENT DOCUMENTS

| | | | |
|---|---|---|---|
| 3,868,581 | 2/1975 | Ahmed | 330/289 |
| 4,142,117 | 2/1979 | Chang | 307/353 |
| 4,240,041 | 12/1980 | Hashimoto et al. | 330/288 |
| 4,292,597 | 9/1981 | Niimura et al. | 330/257 |

FOREIGN PATENT DOCUMENTS

2434947 7/1977 Fed. Rep. of Germany .
2941321 5/1980 Fed. Rep. of Germany .

OTHER PUBLICATIONS

"Radio Fernsehen Elektronik" 26, 1977, No. 23/24, pp. 755-760.
1975 IEEE International Solid-State Circuits Conf. pp. 194-195.
1978 International Solid-State Circuits Conf., pp. 142-143.

*Primary Examiner*—James B. Mullins
*Attorney, Agent, or Firm*—Finnegan, Henderson, Farabow, Garrett & Dunner

[57] ABSTRACT

A current amplifying circuit comprising an input current source connected in series between a power source terminal and a ground terminal, first and second transistors connected diodes, a third transistor whose base is connected to the connecting point of the input current source and the first transistor and whose collector is connected to the power source terminal, and a fourth transistor whose base is connected to an emitter of the third transistor, whose emitter is connected to the ground terminal and whose collector becomes an output terminal. In this circuit, the current source of a current proportional to the input current is inserted between the ground terminal and the emitter of the third transistor, and the current amplification factor is set by the emitter area ratio of the first and fourth transistors and the current ratio of the current sources.

6 Claims, 6 Drawing Figures

CURRENT AMPLIFYING CIRCUIT

BACKGROUND OF THE INVENTION

This invention relates to a current amplifying circuit.

In a circuit utilizing a single power source such as, for instance, a current amplifying circuit used for an IC of a camera, it is generally required that a wide range of input current be accommodated and large and precise current amplification factor be provided when an LED is driven as a load. A conventional current amplifying circuit which satisfies such requirements is very complicated. Further, it is difficult to accurately set the amplification factor.

SUMMARY OF THE INVENTION

An object of this invention is to provide a current amplifying circuit which can obtain a stable and high current amplification factor over a wide input current range, yet achieve this with a simple circuit configuration.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

The objects of this invention can be carried out by the current amplifying circuit of this invention which broadly comprises a diode circuit to which an input current is applied to a high potential terminal thereof, a first transistor whose base is connected to the high potential terminal of the diode circuit, a current source connected to the first transistor for flowing a current proportional to the input current through the first transistor, a second transistor whose base is connected to an emitter of the first transistor and whose emitter is connected to a low potential terminal of the diode circuit, and a current output terminal connected to a collector of the second transistor.

The accompanying drawings, which are incorporated in and constitute a part of this specification, illustrate one embodiment of the invention and, together with the description, serve to explain the principles of the invention.

DETAILED DESCRIPTION OF THE PREFERRED EMBODIMENTS

Figure 1:
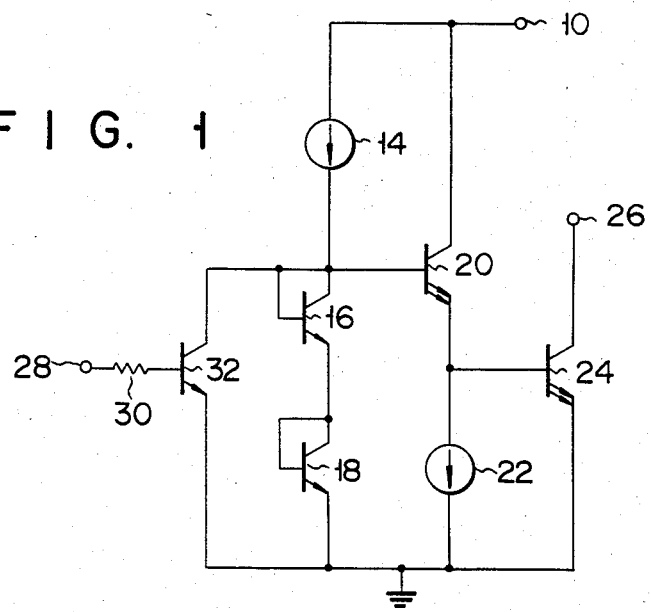
FIG. 1 is a circuit diagram showing the principle of a preferred embodiment of the current amplifying circuit constructed according to the present invention.

A preferred embodiment of a current amplifying circuit of the present invention will now be described in detail with reference to the drawings. FIG. 1 is a circuit diagram showing the principle of the current amplifying circuit of this invention. A first current source 14 and PNP transistors 16 and 18 are connected in series between a power source terminal 10 to which a positive voltage Vcc is applied and a ground terminal. The transistor 16 is connected at its collector to the first current source 14, the transistor 18 is grounded at its emitter, and the collector of each of the transistors 16 and 18 is respectively connected to its base. The collector of the transistor 16 is also connected to base of an NPN transistor 20, collector of the transistor 20 is connected to the power source terminal 10, and the emitter of the transistor 20 is grounded through a second power source 22.

The emitter of the transistor 20 is also connected to the base of an NPN transistor 24, the emitter of the transistor 24 is grounded, and the collector of the transistor 24 is connected to an output terminal 26. A switching terminal 28 is connected through a resistor 30 to the base of an NPN switching transistor 32 the collector of the transistor 32 is connected to the collector of the transistor 16, and the emitter of the transistor 32 is grounded. It is noted that the areas of the emitters of the transistors 20 and 24 are larger than that of the transistors 16 and 18.

The operation of the circuit shown in FIG. 1 will be described. When the switching terminal 28 is high level and the transistor 32 is in the conductive state, the transistors 16 and 18 are in the nonconductive state. Accordingly, the transistor 20 also becomes nonconductive, and a current will not be produced at the output terminal 26. When the switching terminal 28 is in the low level and the transistor 32 is nonconductive state, an output current from the first current source 14 flows through the transistors 16 and 18. Accordingly, a voltage equal to the sum of the forward voltages of the transistors 16 and 18 operating as diodes is applied to the base of the transistor 20. Thus, the transistors 20 and 24 become active, and a current Iout is applied to the output terminal 26.

This output current Iout can be obtained as set forth below. When a transistor is active, a voltage VBE between the base and the emitter generally becomes as set forth below.

$$VBE = VT \cdot \ln \frac{IC}{A \cdot IS} \quad (1)$$

where VT is an electronvolt equivalent of the temperature, IC is a collector current, A is the area of the emitter, and IS is a reverse saturation current.

When the voltages between the base and the emitter of the transistors 16, 18, 20 and 24 in FIG. 1 are designated respectively by VBE(16), VBE(18), VBE(20) and VBE(24), the following relationship can be obtained:

$$VBE(16) + VBE(18) = VBE(20) + VBE(24) \quad (2)$$

When the output currents of the first and second current sources 14 and 22 are represented respectively by Iin1 and Iin2, the collector currents of the transistors 16 and 18 are Iin1 and the collector current of the transistor 20 is Iin2 assuming that the base current of the transistor 24 is ignored. Accordingly, when the formula (1) is substituted for the formula (2), the following formula can be obtained.

$$VT \cdot \ln \frac{Iin1}{A1 \cdot IS} + VT \cdot \ln \frac{Iin1}{A2 \cdot IS} = \quad (3)$$

$$VT \cdot \ln \frac{Iin2}{A3 \cdot IS} + VT \cdot \ln \frac{Iout}{A4 \cdot IS}$$

where A1 through A4 are the areas of the emitters of the transistors 16, 18, 20 and 22, respectively.

The output current Iout can be obtained from the formula (3) as follows.

$$Iout = \frac{A3 \cdot A4}{A1 \cdot A2} \cdot \frac{Iin1^2}{Iin2} \quad (4)$$

the formula (4) can be converted as below when a constant of proportion is represented by k and $$Iout = \frac{A3 \cdot A4}{A1 \cdot A2} \cdot \frac{1}{k} \cdot Iin1 \quad (6)$$

It is understood from the formula (6) that the output current Iout is proportional to the current Iin1 of the first current source 14. A constant of proportion is determined by the current ratio k of the first and second current sources 14 and 22 and the areas A1 through A4 of the areas of the emitters. Accordingly, the current amplification factor G of this circuit can be obtained as below.

$$G = \frac{Iout}{Iin1} = \frac{A3 \cdot A4}{k \cdot A1 \cdot A2} \quad (7)$$

That is, the circuit shown in FIG. 1 operates as a current amplifying circuit, when using the first current source 14 as an input current source and a current source proportional to the input current source 14 as the second current source 22. Since the current amplification factor G is determined only by the ratio of the emitter areas of the transistors and the ratio of the currents thereof, the adverse effects of the temperature, and accordingly the temperature coefficient, can be decreased.

Thus, according to the preferred embodiment of the present invention, the current amplification factor can be set accurately with a single power source, and a current amplifying circuit having a simple configuration can be provided.

Figure 2:
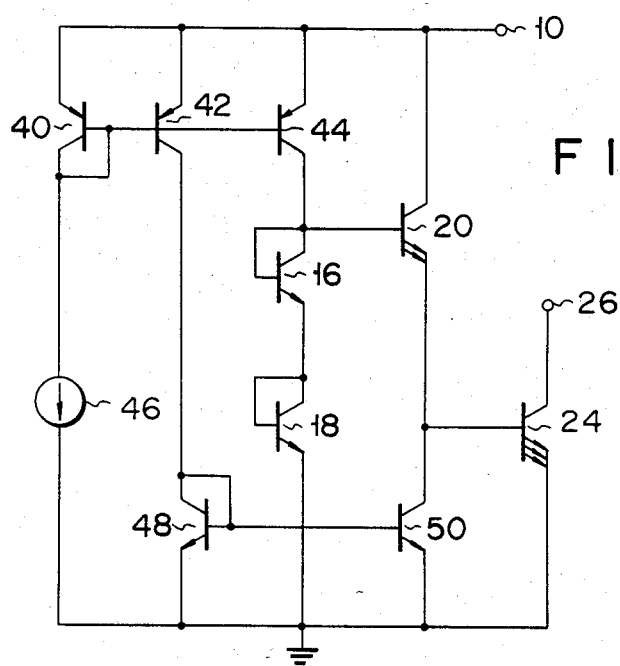
FIG. 2 is a circuit diagram for conducting a simulation of the preferred embodiment shown in FIG. 1.

FIG. 2 shows an experimental circuit diagram for evaluating the characteristics of the principle circuit diagram disclosed as above, wherein the same reference numerals designate the like parts and components shown in FIG. 1. Assume that, when the emitter areas of the transistors 16 and 18 are 1, the emitter areas of the transistors 20 and 24 are 5 and 10, respectively. The power source terminal 10 is connected to emitters of PNP transistors 40, 42 and 44, bases of which being commonly connected, forming a current mirror circuit. The base and collector of the transistor 40 are connected to one another and are grounded through an input current source 46. The collector of the transistor 42 is connected to the collector of an NPN transistor 48 whose base and collector are connected to one another. The collector of the transistor 44 is connected to the collector of the transistor 16. The emitter of the transistor 20 is connected to the collector of an NPN transistor 50. The transistors 48 and 50 are connected at the bases to one another, forming a current mirror circuit, and emitters of the transistors 48 and 50 are grounded. Switching transistor 32 and so forth are omitted since only the amplification factor is measured.

When the output current of the input current source 46 is represented by Iin, a current Iin flows through the collectors of the transistors 40, 42 and 44. Accordingly, the current Iin will also flow through the collector of the transistor 16. Since the collector current of the transistor 42 flows through the collector of the transistor 48 at the input side of the current mirror circuit, the collector current of the output side transistor 50 also becomes Iin. Consequently, the current Iin will also flow through the emitter of the transistor 20. That is, in this circuit k=1. Since $$\frac{A3 \cdot A4}{A1 \cdot A2} = 50,$$

it is set by the current amplification factor G=50.

The result of the simulation conducted by the circuit shown in FIG. 2 was as in Table 1. In Table 1, the voltage Vcc of the power source terminal 10 was 2.1 volts, the voltage Vout of the output terminal 26 was 0.7 volt, the input current Iin was 1 μA to 1 mA, and the operating temperature Ta was 27° C. Since the circuit shown in FIG. 2 operates at low power source voltage, the simulation was conducted at a low power source voltage.

TABLE 1

| Input current (Iin) | Current amplification factor (G) |
|---|---|
| 1 μA | 32 |
| 10 μA | 32 |
| 100 μA | 31 |
| 1 mA | 20 |

It can be understood from the result of this simulation that the current amplification factor G is constant over a wide range of the input current Iin. That is, it is understood that the linearity of the circuit is preferable. However, the current amplification factor G thus obtained was considerably smaller than the designed value 50.

This occurs because the base current of the transistor 24 becomes large when the current amplification factor G becomes large. That is, this is because, when the output current Iout is obtained according to the formula (4), the current flowing through the emitter of the transistor 20 is only a current designated by Iin2 and the base current of the transistor 24 is ignored, but when the current amplification factor G becomes large, the base current of the transistor 24 cannot be ignored. Accordingly, the formula (4) for obtaining the output current Iout is corrected as below.

$$Iout = RA \frac{Iin1^2}{Iin2 + \frac{Iout}{\beta}} \quad (8)$$

where β is emitter common current gain of the transistor 24, $$RA = \frac{A3 \cdot A4}{A1 \cdot A2}.$$

When Iin1=Iin, Iin2=kIin1=kIin (k=1) are substituted in the formula (8), the following formula can be obtained.

$$Iout = RA \frac{Iin^2}{Iin + \frac{Iout}{\beta}} \quad (9)$$

When this formula (9) is solved as to the output current Iout, the following formula can be obtained, $$Iout^2 + \beta \cdot Iin \cdot Iout - \beta \cdot RA \cdot Iin^2 = 0$$

$$Iout = \frac{1}{2}\left(-\beta \pm \sqrt{\beta^2 + 4\beta \cdot RA}\right) Iin$$

Since the output current is positive, the output current can be eventually obtained as below.

$$Iout = \frac{1}{2}\left(\sqrt{\beta^2 + 4\beta \cdot RA} - \beta\right) Iin \quad (10)$$

As a result, the corrected current amplification factor G' becomes as below.

$$G' = \frac{1}{2}\left(\sqrt{\beta^2 + 4\beta \cdot RA} - \beta\right) \quad (11)$$

Where since in the circuit shown in FIG. 2, $\beta = 100$ and $RA = 50$, the corrected current amplification factor G' will become G' = 36.6. This becomes coincident to the result of the above simulation.

When the formula (11) is modified and G' is obtained, the following formula can be obtained.

$$G'^2 + \beta \cdot G' - \beta \cdot RA = 0 \quad (12)$$

Accordingly, if $\beta \to \infty$, $G' \to RA = 50$. Since this is the current amplification factor when the base current is ideally ignored in the transistor 24, the corrected value of the output current by the formula (8) is correct.

Figure 3:
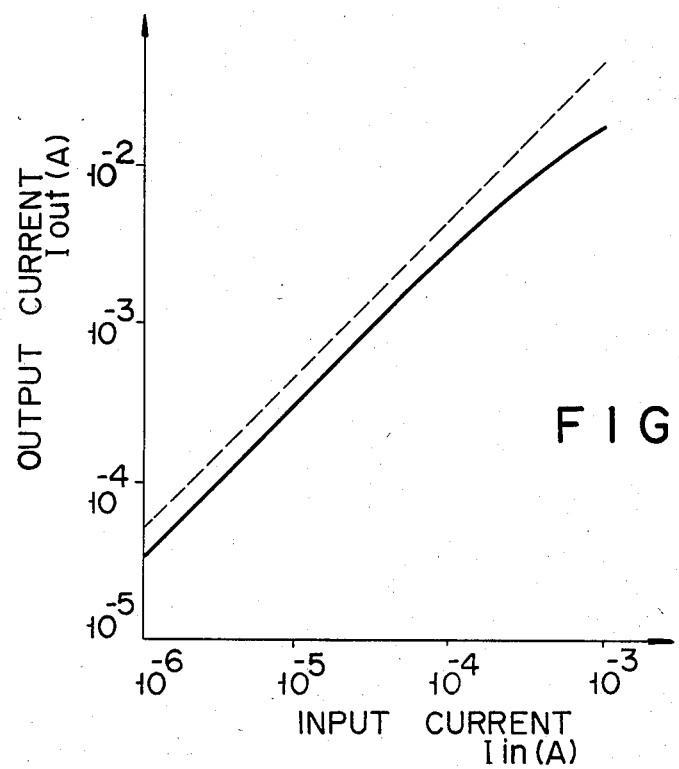
FIG. 3 is a graph showing the result of the simulation.

FIG. 3 shows the characteristics of the output current Iout with respect to the input current Iin. In the graph, a broken line designates the output current of the ideal case, and a solid line designates the result of the simulation conducted by the circuit shown in FIG. 2.

Thus, according to the preferred embodiment of the present invention, there is provided a current amplifying circuit which can obtain a constant current amplification factor over a wide input current range with a simple configuration.

Figure 4:
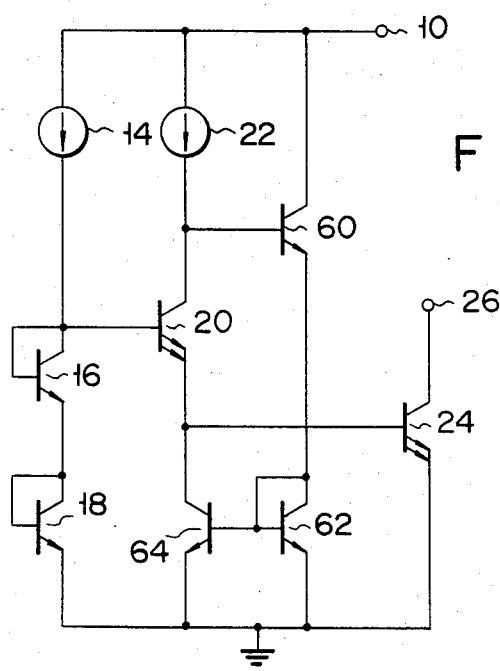
FIG. 4 is a circuit diagram showing the principle of another preferred embodiment of the present invention.

Another preferred embodiment of the current amplifying circuit of the present invention which can decrease the adverse effect of the base current of the output transistor 24 upon the amplification factor G when the G is increased will be described. FIG. 4 shows the principle circuit diagram for carrying out the another invention. In this preferred embodiment, a second current source 22 is not connected to the emitter of transistor 20, but connected between the collector of the transistor 20 and a power source terminal 10. The collector of the transistor 20 is connected to the base of an NPN transistor 60, and the collector of the transistor 60 is connected to the power source terminal 10. The emitter of the transistor 60 is connected to the collector of an NPN transistor 62, the base and collector of which are connected to one another. The emitter of the transistor 20 is connected to the base of the transistor 24 and a collector of an NPN transistor 64. Bases of the transistors 62 and 64 are connected to one another, forming a current mirror circuit, and emitters of the transistors 62 and 64 are grounded. The rest of the circuit is the same as shown in the first preferred embodiment of this invention.

In the circuit shown in FIG. 4, the following relationship is set between the collector current and the emitter current of the transistor 20.

$$Iin2 - IB(60) = \alpha\{IC(64) + IB(24)\} \quad (13)$$

Where the IB(24) and IB(60) are the base currents of the transistors 24 and 60, respectively, the IC(64) is the collector current of the transistor 64, and $\alpha$ is the base common current gain of the transistor 20.

Since the transistors 64 and 62 form a current mirror circuit, the collector currents thereof are equal to one another. Inasmuch as the collector current of the transistor 62 is regarded as being equal to the collector current of the transistor 60, the current IB(60) becomes, when the emitter-grounded current amplification factor of the transistor 60 is represented by $\beta$, $$IB(60) = \frac{1}{\beta} IC(64).$$

Accordingly, if $\alpha = 1$, the formula (13) becomes as below.

$$Iin2 - \frac{1}{\beta} IC(64) = IC(64) + IB(24) \quad (14)$$

Since $\beta$ approximates 100, the second term of the left side of the above formula (14) can be omitted. As a consequence, the formula (14) can be represented as below.

$$Iin2 = IC(64) + IB(24) \quad (15)$$

That is, the emitter current of the transistor 20, as the sum of the collector current IC(64) of the transistor 64 and the base current IB(24) of the transistor 24, is always equal to the second input current Iin2. Accordingly, even if the current amplification factor G becomes large so that the base current of the output transistor 24 becomes large, the collector current of the transistor 20 does not vary with respect to the Iin2. Consequently, the output current Iout can be obtained according to the formula (4), and the current amplification factor G can be accurately set to the value given by the formula (7).

Figure 5:
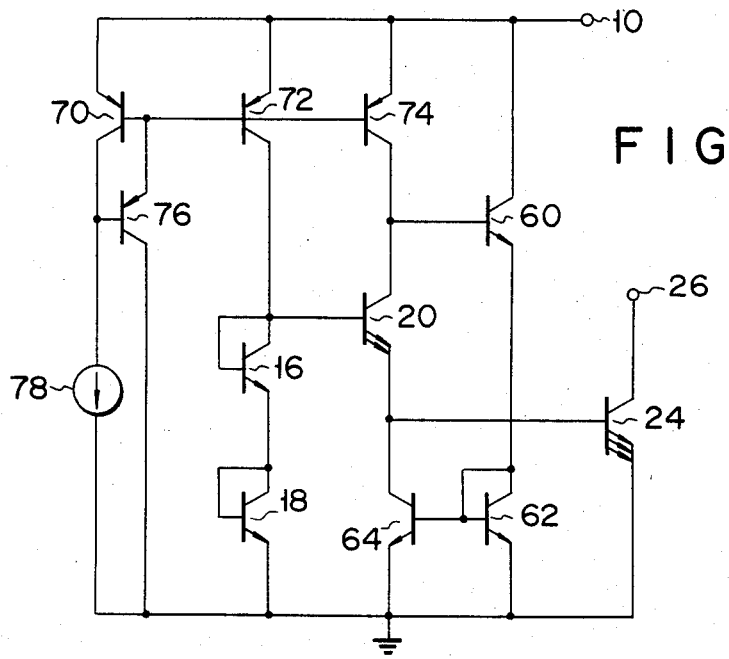
FIG. 5 is a circuit diagram for carrying out a simulation of the another preferred embodiment shown in FIG. 4.

The result of the simulation by this second preferred embodiment will be described. FIG. 5 shows the experimental circuit diagram. The power source terminal 10 is connected to emitters of PNP transistors 70, 72 and 74 forming a current mirror circuit, bases of which are connected to each other. The collector of the transistor 70 is connected to the base of a PNP transistor 76, and grounded through an input current source 78. The base of the transistor 70 is connected to the emitter of the transistor 76, and the collector of the transistor 76 is grounded. The collector of the transistor 72 is connected to the collector of the transistor 16, and the collector of the transistor 74 is connected to the collector of the transistor 20. Assume that the emitter areas of the transistors 16 and 18 are 1, and the emitter areas of the transistors 20 and 24 become respectively 5 and 10.

When the current of the input current source 78 is represented by Iin in this circuit, the current Iin will also flow through the collectors of the transistors 72 and 74. Accordingly, since k=1 in the formula (7) and $$\frac{A3 \cdot A4}{A1 \cdot A2} = 50$$

from the above description, the current amplification factor G is designed to be 50. On the other hand, the result of the simulation conducted under the same conditions as the first embodiment is shown in Table 2 and in a graph in FIG. 6.

TABLE 2

| Input current (Iin) | Current amplification factor (G) |
|---|---|
| 1 μA | 48.6 |
| 10 μA | 48.2 |
| 100 μA | 46.4 |
| 1 mA | 30.0 |

Figure 6:
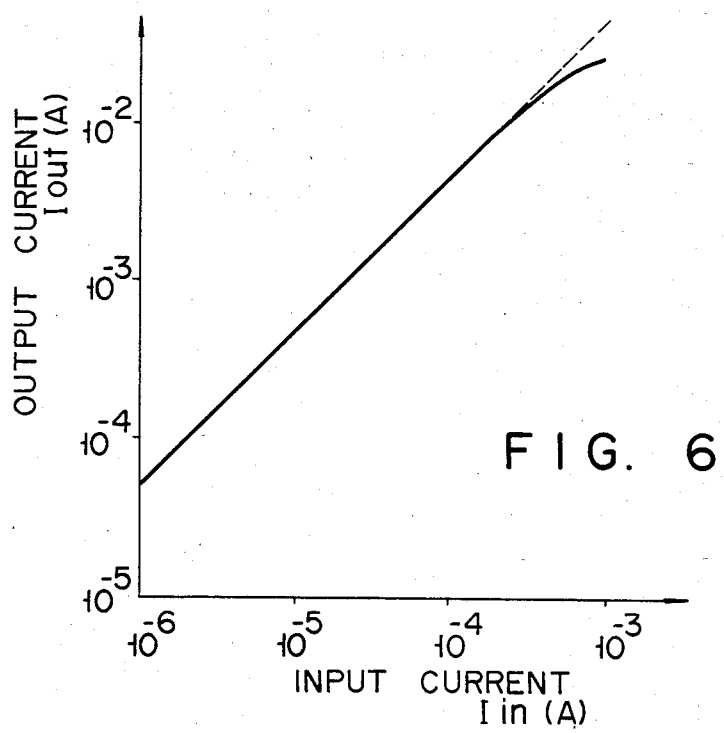
FIG. 6 is a graph showing the result of the simulation shown in FIG. 5.

In FIG. 6, a broken line designates an ideal characteristics (G=50) obtained by the calculation, and a solid line designates the characteristics obtained as a result of the simulation. That is, according to the second preferred embodiment of the present invention, the decrease in the current amplification factor due to the base current of the output transistor 24 can be largely improved. When the input currents are 1 μA to 100 μA, the error rate of the current amplification factor is 38% in the first preferred embodiment, while it is 7.2% in the second preferred embodiment of the present invention.

It should be understood from the foregoing description that the current amplifying circuit of the present invention can operate with a low power source voltage with a single power source and a simple configuration to obtain large current amplification factors which is achieved by controlling the emitter area ratio of the circuit transistors. Further, the present invention is not limited only to the above-described embodiments, but may also be modified by someone skilled in the art without departing from the scope and spirit of the present invention.

What is claimed is:

1. A current amplifying circuit comprising:
   diode means to which an input current is applied to a high potential terminal thereof;
   a first transistor whose base is connected to the high potential terminal of said diode means;
   current source means connected to said first transistor for causing a current lineraly proportional to the input current to flow through said first transistor;
   a second transistor whose base is connected to an emitter of said first transistor and whose emitter is connected to a low potential terminal of said diode means; and
   the current output terminal connected to a collector of said second transistor.

2. The current amplifying circuit according to claim 1, in which the high potential terminal of said diode means is connected through said current source means to a positive potential terminal, and the low potential terminal thereof is connected to a ground terminal.

3. The current amplifying circuit according to claim 2, in which the collector of said first transistor is connected to the positive potential terminal, and said current source means includes a current source having a current proportional to the input current connected between the emitter of said first transistor and the ground terminal.

4. The current amplifying circuit according to claim 3, in which said first and second transistors are NPN type transistors.

5. A current amplifying circuit comprising:
   diode means to which an input current is applied to a high potential terminal thereof;
   a first transistor whose base is connected to the high potential terminal of said diode means;
   current source means connected to said first transistor for causing a current linearly porportional to the input current to flow through said first transistor;
   a second transistor whose base is connected to an emitter of said first transistor and whose emitter is connected to a low potential terminal of said diode means;
   said high potential terminal of said diode means connected through said current source means to a positive potential terminal, the low potential terminal thereof connected to a ground terminal;
   said current source means comprising a current source having a current proportional to the input current which is connected between the collector of said first transistor and the positive potential terminal, a third transistor whose base is connected to the collector of said first transistor and whose collector is connected to the positive potential terminal, and a current mirror circuit having a fourth transistor connected between the emitter of said third transistor and the ground terminal and whose base and collector are connected to one another and a fifth transistor connected between the emitter of said first transistor and the ground terminal; and
   a current output terminal connected to the collector of said second transistor.

6. The current amplifying circuit according to claim 5, in which said first, second, third, fourth and fifth transistors are NPN type transistors.

* * * * *